United States Patent
Herbert et al.

(10) Patent No.: US 6,803,755 B2
(45) Date of Patent: Oct. 12, 2004

(54) MICROELECTROMECHANICAL SYSTEM (MEMS) WITH IMPROVED BEAM SUSPENSION

(75) Inventors: Patrick C. Herbert, Mentor, OH (US); Jeffrey R. Annis, Waukesha, WI (US); Jun J. Yao, San Diego, CA (US); Winfred L. Morris, Thousand Oaks, CA (US); Henric Larsson, Oak Park, CA (US); Richard D. Harris, Solon, OH (US); Robert J. Kretschmann, Bay Village, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 162 days.

(21) Appl. No.: 10/001,412

(22) Filed: Oct. 25, 2001

(65) Prior Publication Data

US 2002/0070723 A1 Jun. 13, 2002

Related U.S. Application Data

(63) Continuation-in-part of application No. 09/406,509, filed on Sep. 28, 1999, now Pat. No. 6,348,788, and a continuation-in-part of application No. 09/400,125, filed on Sep. 21, 1999, now Pat. No. 6,417,743.

(51) Int. Cl.$^7$ .............................................. G01R 33/02
(52) U.S. Cl. ..................... 324/99 R; 324/259; 324/260; 324/158.1
(58) Field of Search ........................... 324/99 R, 158.1, 324/252, 259–260; 310/306–307; 333/42, 189, 240, 24; 73/514.16

(56) References Cited

U.S. PATENT DOCUMENTS

| | | |
|---|---|---|
| 3,886,447 A | 5/1975 | Tanaka |
| 4,560,953 A | 12/1985 | Bozio |
| 5,012,207 A | 4/1991 | Edwards |
| 5,025,346 A | 6/1991 | Tang et al. |
| 5,194,819 A | 3/1993 | Briefer |
| 5,243,861 A | 9/1993 | Kloeck et al. |
| 5,343,157 A | 8/1994 | Deschamps |
| 5,359,893 A | 11/1994 | Dunn |
| 5,413,668 A | 5/1995 | Aslam et al. |
| 5,417,312 A | 5/1995 | Tsuchitani et al. |

(List continued on next page.)

FOREIGN PATENT DOCUMENTS

| | | |
|---|---|---|
| EP | 0 665 590 A2 | 8/1995 |
| EP | 0 711 029 A2 | 5/1996 |
| EP | 0 763 844 A2 | 3/1997 |

OTHER PUBLICATIONS

Storment, C.W., et al. "Flexible, Dry–Released Process for Aluminum Electrostatic Actuators." Journal of Microelectromechanical Systems, 3(3), Sep. 1994, p 90–96.

Toumazou, C. et al., n–step Charge Injection Cancellation Scheme for Very Accurate Switched Current Circuits, Electronic Letters, V.30 (9) 680–681: 1994.

Emmerich, H., et al., A Novel Micromachined Magnetic–Field Sensor, MEMS 99 IEEE Conference, Jan. 17–21, 1999, IEEE Catalog No. 99ch36291c.

(List continued on next page.)

Primary Examiner—Vinh P. Nguyen
(74) Attorney, Agent, or Firm—Quarles & Brady, LLP; R. Scott Speroff

(57) ABSTRACT

In a MEMS device employing a beam supported by transverse arms, potential bowing of the transverse arms caused by fabrication processes, temperature or local self-heating from resistive losses is accommodated by flexible terminations of the transverse arms. Alternatively, this bowing is controlled so as to provide selective biasing to the beam or mechanical advantage in the sensing of beam motion.

34 Claims, 5 Drawing Sheets

U.S. PATENT DOCUMENTS

| | | |
|---|---|---|
| 5,424,650 A | 6/1995 | Frick |
| 5,491,604 A | 2/1996 | Nguyen et al. |
| 5,536,988 A | 7/1996 | Zhang et al. |
| 5,563,343 A | 10/1996 | Shaw et al. |
| 5,572,057 A | 11/1996 | Yamamoto et al. |
| 5,578,976 A | 11/1996 | Yao |
| 5,585,311 A | 12/1996 | Ko |
| 5,600,190 A | 2/1997 | Zettler |
| 5,646,432 A | 7/1997 | Iwaki et al. |
| 5,658,698 A | 8/1997 | Yagi et al. |
| 5,761,350 A | 6/1998 | Koh |
| 5,783,340 A | 7/1998 | Farino et al. |
| 5,798,283 A | 8/1998 | Montague et al. |
| 5,804,314 A | 9/1998 | Field et al. |
| 5,815,051 A | 9/1998 | Hamasaki et al. |
| 5,834,864 A | 11/1998 | Hesterman et al. |
| 5,877,038 A | 3/1999 | Coldren et al. |
| 5,903,380 A | 5/1999 | Motamedi et al. |
| 5,920,978 A | 7/1999 | Koshikawa et al. |
| 5,943,155 A | 8/1999 | Goossen |
| 5,955,932 A | 9/1999 | Nguyen et al. |
| 5,959,516 A | 9/1999 | Chang et al. |
| 5,977,767 A * | 11/1999 | Chaparala .................. 324/260 |
| 5,995,688 A | 11/1999 | Aksyuk et al. |
| 6,046,066 A | 4/2000 | Fang et al. |
| 6,060,336 A | 5/2000 | Wan |
| 6,071,426 A | 6/2000 | Lee et al. |
| 6,094,102 A | 7/2000 | Chang et al. |
| 6,100,477 A | 8/2000 | Randall et al. |
| 6,114,794 A | 9/2000 | Dhuler et al. |
| 6,116,756 A | 9/2000 | Peeters et al. |
| 6,127,767 A | 10/2000 | Lee et al. |
| 6,137,206 A | 10/2000 | Hill |
| 6,144,545 A | 11/2000 | Lee et al. |
| 6,149,190 A | 11/2000 | Galvin et al. |
| 6,159,385 A | 12/2000 | Yao et al. |
| 6,170,332 B1 | 1/2001 | MacDonald et al. |
| 6,188,322 B1 | 2/2001 | Yao et al. |
| 6,232,150 B1 | 5/2001 | Lin et al. |
| 6,232,841 B1 | 5/2001 | Bartlett et al. |
| 6,232,847 B1 | 5/2001 | Marcy, 5th et al. |
| 6,236,281 B1 | 5/2001 | Nguyen et al. |
| 6,257,705 B1 | 7/2001 | Silverbrook |
| 6,265,238 B1 | 7/2001 | Yaji et al. |
| 6,275,034 B1 * | 8/2001 | Tran et al. .................. 324/259 |
| 6,307,169 B1 | 10/2001 | Sun et al. |
| 6,316,278 B1 | 11/2001 | Jacobsen et al. |
| 6,348,788 B1 | 2/2002 | Yao et al. |
| 6,356,378 B1 | 3/2002 | Huibers |
| 6,356,689 B1 | 3/2002 | Greywall |
| 6,373,682 B1 | 4/2002 | Goodwin-Johansson |
| 6,384,353 B1 | 5/2002 | Huang et al. |
| 6,391,742 B2 | 5/2002 | Kawai |
| 6,400,009 B1 | 6/2002 | Bishop et al. |
| 6,411,214 B1 | 6/2002 | Yao et al. |
| 6,417,743 B1 | 7/2002 | Mihailovich et al. |
| 6,463,339 B1 | 10/2002 | Vasko |
| 6,465,929 B1 | 10/2002 | Levitan et al. |
| 6,466,005 B1 | 10/2002 | Yao et al. |
| 6,497,141 B1 | 12/2002 | Turner et al. |
| 6,504,356 B2 | 1/2003 | Yao et al. |
| 6,583,374 B2 * | 6/2003 | Knieser et al. .......... 73/514.16 |
| 6,670,212 B2 | 12/2003 | McNie et al. |

OTHER PUBLICATIONS

Madou, Marc, Fundamentals of Microfabrication, Chapters 2–4, CRC Press LLC, Boca Raton, FL: 1997.

Kovacs, Gregory T.A., Micromachined Transducers Sourcebook, Table of Contents, pp. 77–119 and Index, WCB McGraw–Hill, U.S.A.: 1998.

Teegarden, Darrell et al., How to Model and Simulate Microgyroscope Systems, IEEE Spectrum, 66–75, Jul. 1998.

Emmerich, Harald et al., Magnetic Field Measurements with a Novel Surface Micromachined Magnetic–Field Sensor, IEEE Transactions on Electron Devices, V. 47 (5) 972–977, May 2000.

McGruer, N.E. et al., Electrostatically Actuated Microswitches; Scaling Properties, Solid–State Sensor and Actuator Workshop, Hilton Head Island, South Carolina, Jun. 8–11, 1998, pp. 132–135.

Miyajima, Hiroshi et al., High–Aspect–Ratio Photolithography for MEMS Applications, J. of Microelectromechanical Sys., V. 4(4) 220–229, Dec. 1995.

Lu, Crist et al., A Monolithic Surface Micromachined Accelerometer with Digital Output, IEEE J. of Solid State Circuits, V. 30 (12) 1367–1373, Dec. 1995.

Chen, Ming–Jer et al., Weak Inversion Charge Injection in Analog MOS Switches, IEEE J. of Solid–State Circuits, V. 30 (5) 604–606, May 1995.

Lemkin, Mark A. et al., A Fully Differential Lateral S7 Accelerometer with Drift Cancellation Circuitry, Solid–State Sensor and Actuator Workshop, Hilton Head, South Carolina, Jun. 2–6, 1996, pp. 90–93.

Boser, Bernhard E. et al., Surface Micromachined Accelerometers, IEEE J. of Solid–State Circuits, V. 31 (3) 366–375, Mar. 1996.

Fedder, Gary K. et al., Multimode Digital Control of a Suspended Polysilicon Microstructure, J. of Microelectromechanical Sys., V. 5 (4) 283–297, Dec. 1996.

Noriega, Gararedo, Sigma–Delta A/D Converters–Audio and Medium Bandwidths, Technical Notes–DT3 from RMS Instruments website: www.rmsinst.com, 6 pages, Feb. 1996.

Internet page: Decimator Filter DLL, NeuroDimension Inc.: www.nd.com, May 31, 2001.

U.S. patent application No.: 09/406,654, filed on Sep. 27, 1999, (U.S. Pat No. 6,463,339).

U.S. patent application No.: 09/400,125, filed on Sep. 21, 1999, (U.S. Pat No. 6,417,743).

U.S. patent application No.: 09/406,509, filed on Sep. 28, 1999, (U.S. Pat No. 6,348,788).

U.S. patent application No.: 09/955,493, filed on Sep. 18, 2001, (U.S. Pat No. 6,504,356).

U.S. patent application No.: 09/955,494, filed on Sep. 18, 2001, (Pat No. 6,466,005).

U.S. patent application No.: 09/675,861, filed on Sep. 29, 2000, (Pat No. 6,411214).

* cited by examiner

MICROELECTROMECHANICAL SYSTEM (MEMS) WITH IMPROVED BEAM SUSPENSION

CROSS-REFERENCE TO RELATED APPLICATIONS

This application is a continuation-in-part of U.S. applications Ser. No. 09/406,509 filed Sep. 28, 1999 now U.S. Pat. No. 6,348,788 and Ser. No. 09/400,125 filed Sep. 21, 1999 now U.S. Pat. No. 6,417,743.

STATEMENT REGARDING FEDERALLY SPONSORED RESEARCH OR DEVELOPMENT

BACKGROUND OF THE INVENTION

The present invention relates to microelectromechanical systems (MEMS) and in particular to MEMS devices employing beams supported for movement on flexible transverse arms.

MEMS devices are extremely small machines fabricated using integrated circuit techniques or the like. The small size of MEMS devices allows the production of high speed, low power and high reliability mechanisms. The fabrication techniques hold the promise of low cost mass production.

The parent applications to this present application describe a MEMS electrical isolator in which a beam is supported for longitudinal movement on a set of axially flexible arms, the latter of which are tied to a substrate. Motion of the beam caused by a MEMS actuator at one end of the beam, transmits a signal to a sensor positioned at the other end of the beam and separated from the actuator by an insulating segment.

The structure of a beam supported by transverse flexible elements provides an extremely simple and robust MEMS device. Nevertheless, the precision required for certain applications, particularly those related to sensors, may be difficult to achieve using mass-production integrated circuit processes.

BRIEF SUMMARY OF THE INVENTION

The present inventors have recognized that the complex multicomponent integrated circuit materials from which MEMS devices are constructed, have widely varying coefficients of expansion which may create distortions and stress in the MEMS beam structure (particularly in the flexible arms supporting the beam) as the MEMS device cools from high processing temperatures, or when the MEMS devices is used at different operating temperatures, or when the MEMS device is subject to local self-heating from the conduction of current. These distortions and stresses limit the beam structure's application to certain precision applications.

Accordingly, the present invention provides several techniques to compensate for such dimensional distortions and stress in beam-type MEMS devices, allowing mass-production of increasingly precise and accurate mechanisms. The present invention further provides methods of controlling the typical distortions in the flexible arms to provide increased functionality in beam-type MEMS devices.

In this regard, the invention provides improved methods of attaching the flexible arms that support the beam to the substrate. These attachment methods are augmented by enforcement of conditions of symmetry on the beam and its structure. Control of bowing of the transverse arms, discovered by the inventors in connection with their study of temperature induced distortions of the MEMS structure, is used to add bias or bi-stability or mechanical amplification to the MEMS device.

Specifically then, the present invention provides a MEMS system having a beam supported on flexible transverse arms to move longitudinally along a substrate wherein ends of the transverse arms removed from the beam are connected to the substrate by elements allowing transverse movement of the ends of the arms. This transverse movement may be provided, for example, by a flexible longitudinally extending wrist.

It is one object of the invention, therefore, to provide an attachment system for the transverse arms that accommodates transverse dimensional changes in the arms caused by temperature changes and which, if uncorrected, can cause buckling of the arms, stress stiffening of the arms, or offset of the beam from its null position.

The wrist elements may attach to the transverse arms via arcuate sections.

Thus, it is another object of the invention to eliminate points of concentrated stress at the arm ends.

The wrist elements may include serpentine sections, and/or the serpentine sections may be placed at the ends of the transverse arms where they are attached to the wrist elements.

Thus, it is another object of the invention to provide an attachment mechanism for the transverse arms that is both transversely and rotationally unrestrained so as to mimic a "free beam" whose ends are unrestrained. Transverse arms that approximate a free beam provides a less stiff bending force with movement of the supported beam and avoid stress stiffening such as may change the dynamic characteristics of the MEMS device.

The beam may be supported at longitudinally opposed ends by pairs of transverse arms extending from either side of the beam and the wrist elements for the transverse arms may either all extend toward the center of the beam or all extend away from the center of the beam.

Thus, it is another object of the invention to balance any forces on the beam caused by a slight bowing of the transverse arms such as may be incurred by an expansion of those arms or other distortions by encouraging countervailing bowing. It is a further object of the invention to compensate for any Lorentz forces that may occur on the wrists when current is passed through the transverse arms. By facing the wrists in the same direction, a transverse balancing of Lorentz forces from the wrists is obtained.

The beam may be supported at its center by a pair of transverse arms extending from the beam on opposite sides of the beam and the wrist elements for the center transverse arm may extend in opposite longitudinal directions.

Thus it is another object of the invention to promote an S-shape bending for a transverse arm centered on the beam such as prevents any longitudinal biasing of the beam as would occur with an uninflected bowing. Such a central beam may have no current flowing through it to eliminate any issues with Lorentz forces.

The beam may be designed to stabilize at a dimension that places the respective pairs of transverse arms on either end of the beam in equal and opposite flexure: either bowing in or bowing out.

Thus, it is another object of the invention to balance any of the forces that may be placed on the beam by distortions in the lengths of the flexible arms.

The transverse arms may also be made of equal length. The points of attachment of the transverse arms to other than at ends of the beam may be centered between the points of attachment of the transverse arms at the end of the beam. The actuator and biasing structures for the beam may be placed at the end of the beam.

Thus, it is another object of the invention to enforce a longitudinal and transverse symmetry on the MEMS device so that other effects of dimensional distortion in the transverse arms and beam are balanced out.

In one embodiment, the beam may be supported on at least one pair of flexible transverse arms, which are bowed to present a force that increasingly resists longitudinal motion of the beam in a first direction up to a snap point after which the force abruptly decreases. The force may change direction after the snap point or keep the same direction.

Thus, it is another object of the invention to provide a bistable or monostable mode of operation of the beam device.

After the snap point, the bow may increasingly resist longitudinal motion of the beam in a second direction opposite the first direction up to a second snap point at which the force abruptly decreases. The second snap point may be different from the first snap point.

Thus, it is another object of the invention to provide for a hysteresis actuation of the beam using mechanical elements.

In a different embodiment, the beam may be supported by at least one flexible transverse arm, which is angled to also extend longitudinally. A sensor detecting transverse motion may receive the first transverse arm at an end removed from the beam.

Thus, it is another object of the invention to provide for a mechanical amplification of either the force or motion of the beam as transmitted to the sensor structure.

The foregoing objects and advantages may not apply to all embodiments of the inventions and are not intended to define the scope of the invention, for which purpose claims are provided. In the following description, reference is made to the accompanying drawings, which form a part hereof, and in which there is shown by way of illustration, a preferred embodiment of the invention. Such embodiment also does not define the scope of the invention and reference must be made therefore to the claims for this purpose.

DETAILED DESCRIPTION OF THE PREFERRED EMBODIMENT

Figure 1:
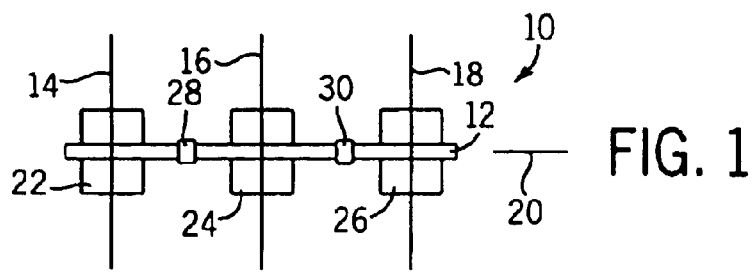
FIG. 1 is a simplified block diagram of a beam-type MEMS device of the present invention in which the beam is supported on three sets of transversely extending arms.

Referring now to FIG. 1, a MEMS device 10 of the present invention may include a longitudinal beam 12 supported on three pairs of transverse arms 14, 16 and 18, where transverse arms 14 extend from opposite sides of the leftmost longitudinal end of the beam 12, transverse arms 16 extend from opposite sides of the longitudinal center of beam 12, and transverse arms 18 extend from opposite sides of the rightmost longitudinal end of the beam 12. As supported by flexing of the transverse arms 14, 16 and 18, the beam 12 is free to move along a longitudinal axis 20.

This beam structure can provide a number of useful MEMS by employing a combination of an actuator 22, sensor 24 and biasing means 26 distributed along the beam 12 and possibly separated by insulating sections 28 and 30. Generally, the actuator 22 and biasing means 26 may be any of a Lorentz force motor, an electrostatic motor, a piezoelectric motor, a thermal-expansion motor, and a mechanical-displacement motor, and the sensor 24 may be any of a capacitive sensor, a piezoelectric sensor, a photoelectric sensor, a resistive sensor, an optical switching sensor, or inductive sensor.

Figure 2:
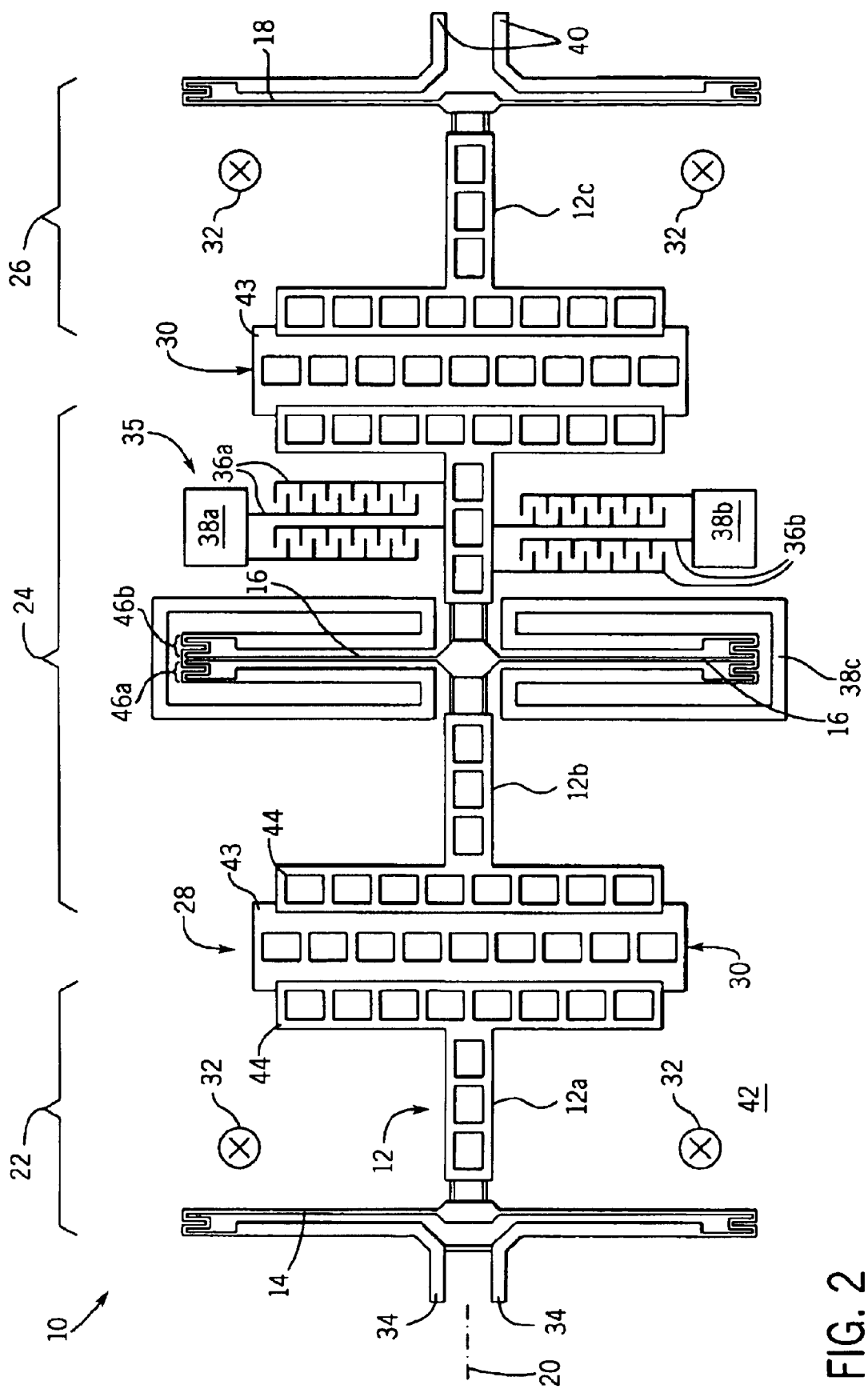
FIG. 2 is a detailed, top plan view of the beam-type device of FIG. 1 for use as an electrical isolator, the device using three electrostatic motors and a capacitive sensor attached to the beam and having wrist elements attaching the transverse arms to the substrate.

Referring now to FIG. 2, a MEMS device 10 for use as an electrical isolator and constructed according to the beam structure of FIG. 1, provides a beam 12 divided into conductive beam portions 12a, 12b and 12c separated by insulating sections 28 and 30. The actuator 22 may be a Lorentz force actuator conducting a current along the transverse arm 14 in the presence of a magnetic field 32 to produce a force along longitudinal axis 20. Current may be provided to the transverse arm 14 through terminals 34.

A sensor 24 may be provided by capacitor banks 35 having inter-digitated capacitor plates 36a and 36b, where the spacing of plates 36a increases with rightward longitudinal movement of the beam 12 and the spacing of plates 36b decreases with rightward movement. A comparison of the capacitances of plates 36a and 36b accessible through terminals 38a, 38b and 38c provides a position measurement of the beam 12 with a null position ideally being where the capacitances of plates 36a and 36b are equal. Precise location of the beam 12 both in a longitudinal and transverse manner is desired for proper operation of the capacitor plates 36a and 36b.

Finally, a biasing means 26 is provided by a Lorentz force motor formed by current passing through transverse arm 18 introduced by means of terminals 40 in magnetic field 32.

The structure of the MEMS device 10 generally includes as many as three layers including, for example, a metal layer, a silicon layer and an oxide layer. The structure of the beam 12 and transverse arms 14, 16, and 18, shown in FIG. 2 may include all three layers which are cut away from a substrate 42 to be free therefrom, with the ends of the transverse arms 14, 16, and 18 distal to the beam 12, connected to the substrate 42 only at the terminals 34, 38 and 40. The insulating sections 28 and 30 may be produced by removing an upper layer of metal and silicon 44 leaving only a bridge of oxide, or by other similar methods.

In operation, a current passing through transverse arm 14 creates an actuation force via its interaction with the magnetic field 32 causing movement of the beam 12 against a biasing force created by current passing through transverse arm 18. The net effect is sensed by capacitor banks 36a and 36b. In this way, an analog or digital isolator may be produced or a sensitive magnetic field measuring or current measuring device as well as many other devices.

Figure 3:
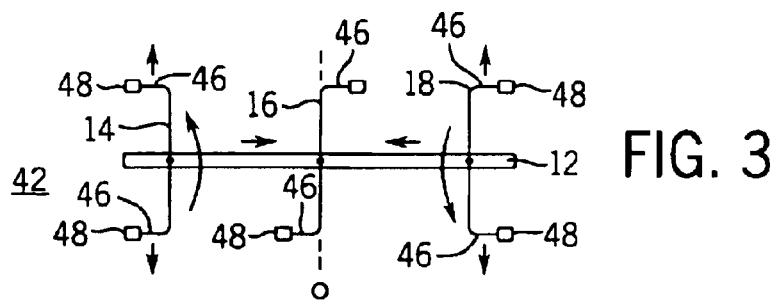
FIG. 3 is a schematic diagram of a simplified wrist element of FIG. 2 such as provide transverse movement of the ends of the transverse arms and balanced Lorentz forces.

Referring now to FIG. 3, each of the transverse arms 14, 16 and 18 may be connected through longitudinal wrist elements 46 to stationary pylons 48 being attached to the substrate 42. The longitudinal wrist elements 46 allow some transverse movement of the distal ends of the transverse arms 14, 16 and 18 in the event of dimensional variations or expansion caused by electrical conduction.

Figure 5:
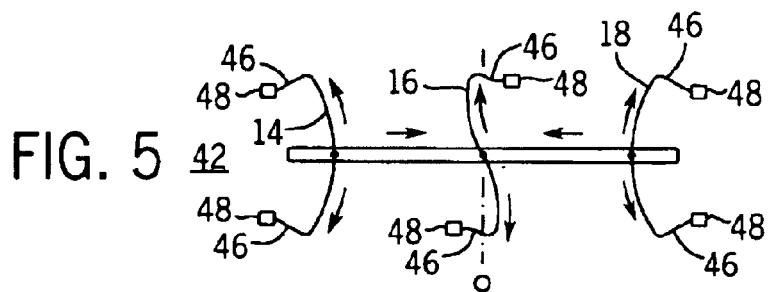
FIG. 5 is a figure similar to that of FIG. 3 showing an exaggeration expansion of the outer transverse arms that cause an inward bowing of the outer arms such as produces countervailing forces and an S bowing of the center transverse arms that produces a torsion but no net longitudinal force.

Referring to FIG. 5, this transverse compliance provided by the wrists 46 reduces the bowing or distortion of the transverse arms 14, 16 and 18 (exaggerated in FIG. 5) and prevents stress stiffening of the transverse arms 14, 16 and 18 such as would change the resonate frequency (or spring constant) of the beam 12 or the forces necessary to actuate the beam 12.

In order to neutralize the effects of the Lorentz forces on the wrists 46, the wrists 46 of current conducting transverse arms 14 and 18 are both directed in the same direction for transverse arm pairs 14 and 18. Further, the wrists 46 of transverse arms 14 and 18 may be directed in opposite directions either both facing outward or both facing inward so as to direct any bowing in the transverse arms 14 and 18 in opposite directions so as to cancel the resulting force on the beam 12. Judicious selection of the expansion characteristics of the beam 12 may promote an inward or outward bowing so as to ensure this balanced opposite bowing force.

In contrast, the wrists 46 of the conductive transverse arms 16 extending from the center of the beam 12 face in opposite longitudinal directions. This creates a more complex S shape bowing shown in FIG. 5 with relative lengthening of the transverse arm 16 which provides a slight torsion but no net longitudinal force to the beam 12. In this way, the null position of the beam (for example, as dictated by a midrange separation of the capacitor plates of the sensor) is preserved despite dimensional distortions caused by uneven contraction or expansion rates of the various components of the MEMS device 10.

Figure 4:
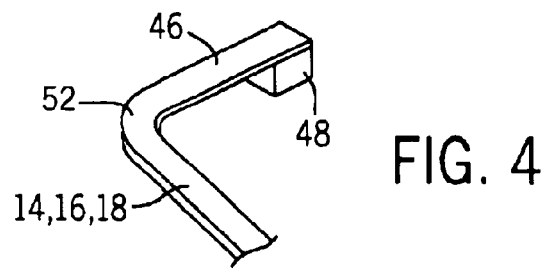
FIG. 4 is a perspective fragmentary view of a wrist element of FIG. 3 showing an arcuate transition to reduce stress concentration.

Referring now to FIG. 4, the wrists 46 may be attached to any of the transverse arms 14, 16 or 18 by means of a smoothly curving arcuate section 52 such as eliminates points of concentrated stress.

The above-described wrist elements 46 may accommodate dimensional changes caused by the manufacturing process or by local self-heating caused by currents used in the Lorentz actuators and biasing means. Variation in these dimensions caused by different ambient operating conditions may be reduced by the use of outriggers 54 of FIG. 6 (one pair associated with each of transverse arms 14, 16 and 18) attached to pylons 48 adjacent to the beam 12 and extending transversely outward by nearly the full length of the transverse arms 14, 16 and 18. The transverse arms 14, 16 and 18 may be attached by the laterally extending wrists 46 to the outboard ends of the outriggers 54 which are ideally constructed of the same materials as the wrists 46 and transverse arms 14, 16 and 18 to provide for compensating expansion. It will be understood that by using the outriggers 54, expansion of the material of the transverse arms 14, 16 and 18 such as would cause a slackening of transverse arms 14, 16 and 18 is compensated for by nearly equal expansion of outriggers 54, and vice versa.

Figure 6:
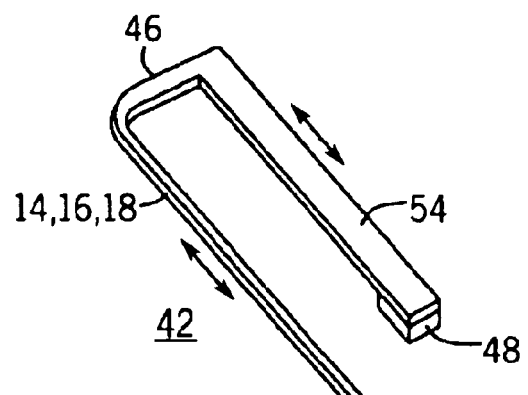
FIG. 6 is a fragmentary view similar to that of FIG. 4 showing the addition of an expansion outrigger to the wrists counteracting expansion induced stress in the transverse arms.

Referring now to FIG. 6, the outriggers 54 are attached only at pylons 48 leaving the remainder of the wrists 46 and the transverse arms 14, 16 and 18 free above but lying in the plane of substrate 42.

Figure 7:
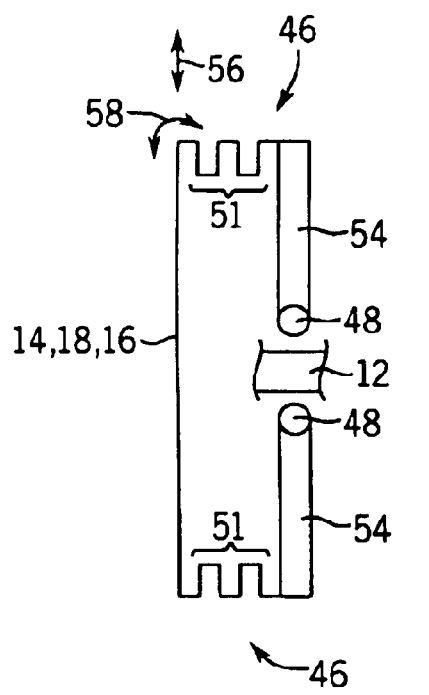
FIGS. 7 and 8 show the addition of serpentine portions to the wrists and ends of the transverse arms such as provide both additional transverse compliance and rotational freedom simulating a free beam structure.

Referring to FIG. 7, the wrists 46 may be modified to provide for a serpentine portion 51 providing both the transverse freedom shown by arrow 56 and increased rotational freedom shown by arrow 58 such as simulates a "free beam" configuration for transverse arms 14, 16 and 18 providing a less stiff and more uniform characteristic to their flexure.

Figure 8:
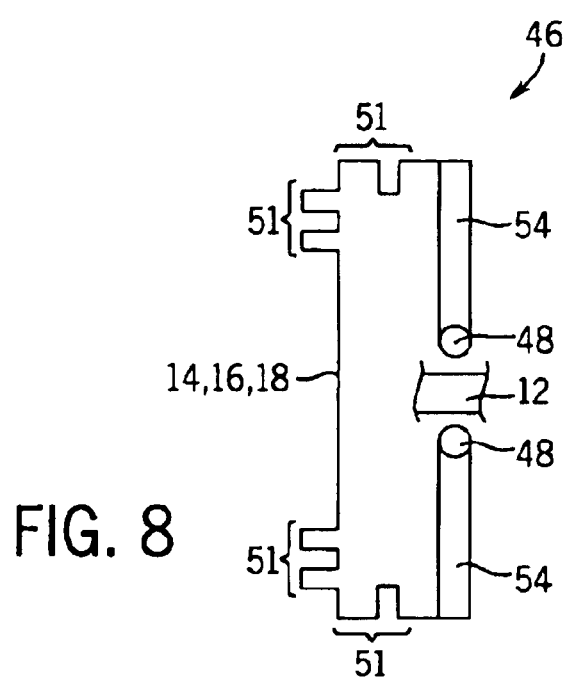

Referring to FIG. 8, it will be seen that the serpentine portion 51 may be extended to the distal ends of the transverse arms 14, 16 and 18 to provide further flexure and further may be placed on the distal ends of the transverse arms 14, 16 and 18, in lieu of their placement on the wrists 46 (not shown). The serpentine portions 51 may be crenellated as shown or may be a smoother curve to eliminate stress concentrations.

Referring again to FIG. 2, the wrists 46, in an alternative embodiment particularly suited for transverse arm 16 may provide for two opposed wrist portions 46a and 46b extending in opposite longitudinal directions from the distal end of the transverse arm 16 to a T-configuration such as also may provide a neutral compensation for expansion of transverse arm 16 without the need for the S shaped bowing.

Figure 9:
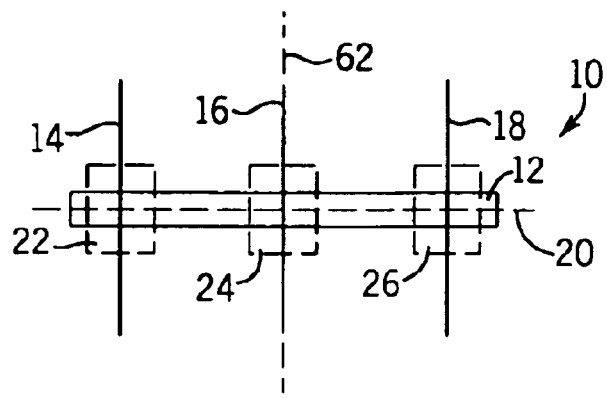
FIG. 9 is a diagram similar to FIG. 1 showing major axes of symmetry, which are preserved in the invention to counteract additional forces.

Referring now to FIG. 9, improved immunity to dimensional changes occurring during the fabrication process may be obtained by providing for strict symmetry of the MEMS device 10 along a longitudinal axis 20 passing through the beam 12 along its midpoint and a transverse axis 62 cutting the beam 12 transversely into two equal segments with respect to transverse arms 14 and 18. This provides equal length of the transverse arms 14, 16 and 18 causing forces induced by these arms in contraction or expansion to be roughly equal preserving the midline alignment of the beam 12 along longitudinal axis 20, whereas positioning transverse arm 16 midway between transverse arms 14 and 18 provide that the null point measured at the midpoint of the beam 12 remain roughly at the same location with respect to the substrate despite length differences in the beam 12 itself such as may draw the transverse arms 14 and 18 into a bow or expand them outward.

For similar reasons the actuator 22 and biasing means 26 may be placed symmetrically on opposite sides of the beam 12 and the sensor 24 sensing the null point as close as possible to the center of the beam 12 as determined by the connections of the beam 12 to the transverse arms 14 and 18.

Figure 10:
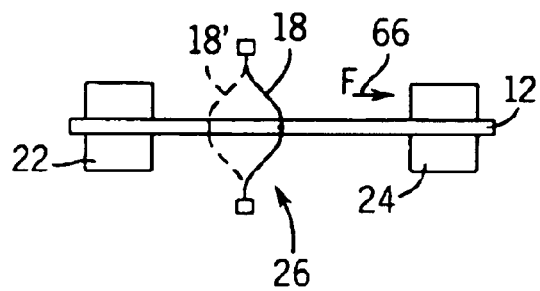
FIG. 10 is a figure similar to that of FIG. 3 showing an exploitation of expansion induced bowing to create a bistable biasing on the beam.
Figure 11:
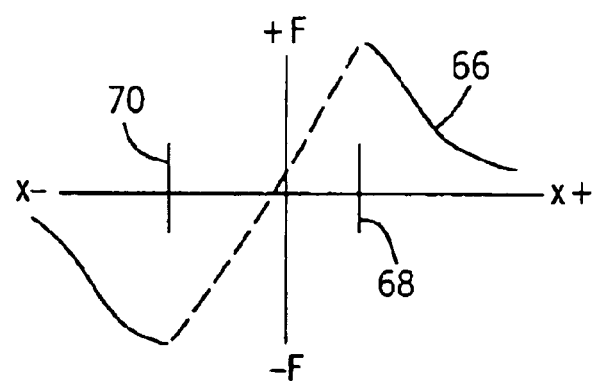
FIG. 11 is a plot of force versus longitudinal displacement of the beam showing the snap action created by buckling of the bowed transverse arm of FIG. 10.

Referring now to FIGS. 10 and 11, the bowing of a beam 12, for example, of transverse arm 18 (or any of the transverse arms) may be exploited to provide a biasing force to the beam 12. Under this construction, the actuator 22 would be positioned at one end of the beam 12 and the sensor 24 positioned at the other end of the beam 12. The bowing creates a snap action occurring as the beam 12 is moved from left to right. As a result of the bowing of the transverse arm 18, which in this example is to the right, the force 66 resisting the rightward longitudinal movement of the beam is positive (rightward) and increases up to a snap point 68 whereupon the bow of the transverse arm 18 buckles and reforms as a bow in the opposite direction shown by dotted line of transverse arm 18'. This in turn results in a reversal of the force 66 to negative (leftward) past snap point 68.

Now motion of the beam 12 in the opposite direction from left to right causes the experience of an increasing negative force pushing the beam backward to the left up to a second snap point 70 whereupon the force reverts again to a positive direction and the beam moves fully to the right if unimpeded. The two snap points 68 and 70 provide a degree of hysteresis that may be desirable for certain applications and create in effect a bistable beam 12 as may be useful to provide a memory element. This mechanical memory element may be combined with other devices including accelerometers or isolators, or current or magnetic field sensors.

Figure 12:
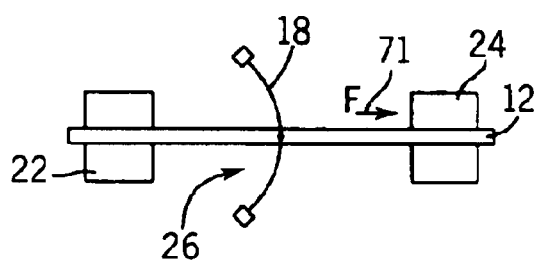
FIG. 12 is a figure similar to that of FIG. 10 showing a fabricated stress-free bowing of a pair of transverse arms to provide a monostable biasing of the beam.
Figure 13:
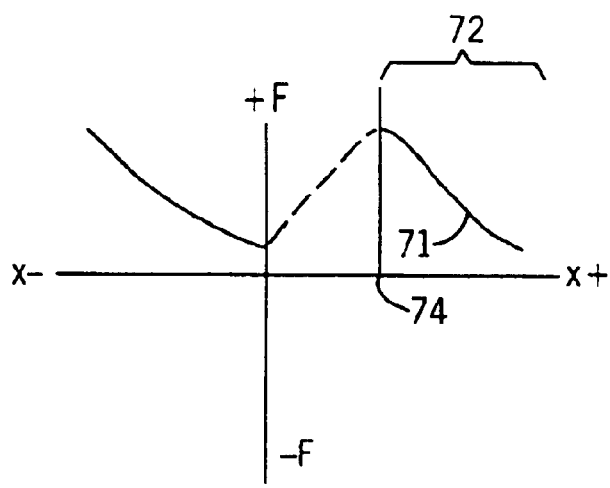
FIG. 13 is a plot similar to that of FIG. 11 showing the monostable biasing provided by the bowing of the transverse arm of FIG. 12.

Referring now to FIGS. 12 and 13, the bowing created by the transverse arm 18 of FIG. 10 was induced by exploiting the differences in expansion coefficients of the various MEMS materials and thus puts transverse arm 18 in a stressed state. However, a bowing may also be created in a stress-free transverse arm 18 by forming the transverse arm 18 into a bowed configuration during fabrication, for example, etching the transverse arm 18 in a bowed shape. In this case, the force 71 may be employed in a monotonically increasing region 72 providing a simple biasing force always in a positive direction or may be used outside of region 72 to a buckling point 74 after which the force 71 decreases returning only to an increasing mode after some additional distance is traversed, however, at no point becoming a negative force such as would create the bi-stability of the device of FIG. 10. In this way, a monostable device may be created.

Figure 14:
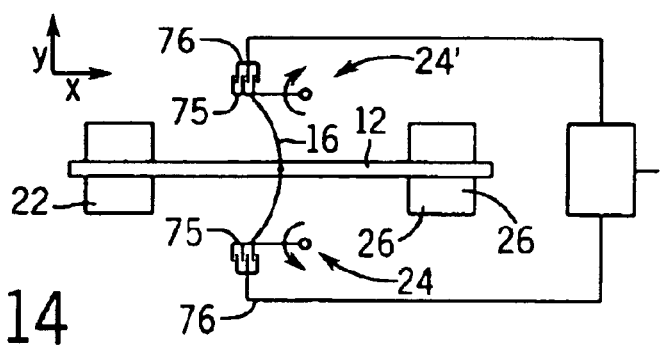
FIG. 14 is a figure similar to that of FIG. 12 showing attachment of the bowed transverse arm to movable position sensors, the arm such as may provide a mechanical leverage increasing sensitivity of the sensors to longitudinal movement of the beam.
Figure 15:
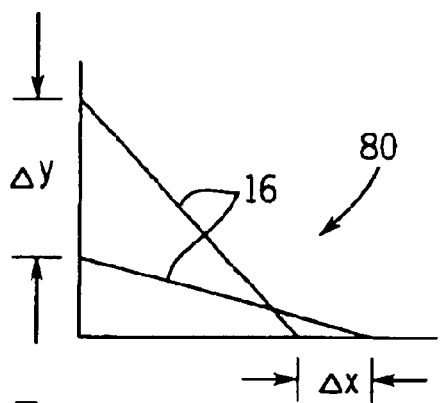
FIG. 15 is a geometric diagram showing the mechanical amplification provided by the bowed beam of FIG. 14 reduced to a trigonometric approximation.

Referring now to FIG. 14, an intentional bowing of transverse arm 16, for example, may provide for a mechanical lever communicating between the beam 12 and a position sensor 24' in this case formed of interleaving capacitor plates 75 and 76 with capacitor plate 75 being movable in the transverse direction and capacitor plates 76 being fixed. Capacitor plates 75 are attached to the distal end of transverse arm 16 removed from the beam 12 so as to be pushed outward by the transverse arm 16 with motion, in this case leftward, by the beam 12. This transverse motion is controlled by the slight longitudinal bending of the transverse arm 16 such as approximates a triangle 80 as shown in FIG. 15. Via the transverse arm 16, small longitudinal motions $\Delta x$ of the beam 12 being converted to the greater or lesser transverse motions $\Delta y$ acting on capacitor plates 75. Depending on the particular angle of the transverse arm 16, the leverage may create additional motion or additional force. The decree of additional motion or mechanical advantage was determined by the amount of longitudinal extent of the transverse arm 16 according to well-understood trigonometric principals.

In an alternative embodiment, the position sensors 24' may be operated as electrostatic motors to change the stress in the transverse arm 16 and therefore its frequency characteristics and those of the system, where tightening the transverse arm 16 would increase the natural resonant frequency of movement of the beam 12. In yet a further alternative embodiment, the motors could be used to adjust the bowing of the transverse arms 16 so as to move the beam 12 as a bias method or to control the amount of bias force on the beam 12.

It is specifically intended that the present invention not be limited to the embodiments and illustrations contained herein, but that modified forms of those embodiments including portions of the embodiments and combinations of elements of different embodiments also be included as come within the scope of the following claims.

We claim:

1. A microelectromechanical system (MEMS) comprising:
   a beam supported on flexible transverse arms to move longitudinally along a substrate, wherein ends of the arms removed from the beam are connected to the substrate by flexible elements allowing transverse movement of the ends of the arms.

2. A microelectromechanical system (MEMS) comprising:
   a beam supported on flexible transverse arms to move longitudinally along a substrate, wherein ends of the arms removed from the beam are connected to the substrate by flexible longitudinally extending wrist elements.

3. The microelectromechanical system of claim 2 wherein the wrist elements are serpentine.

4. The microelectromechanical system of claim 3 wherein the ends of the arms removed from the beam are serpentine.

5. The microelectromechanical system of claim 2 wherein the ends of the arms removed from the beam are serpentine.

6. The microelectromechanical system of claim 2 wherein the beam is supported at longitudinally opposed ends by respective pairs of transverse arms extending from the beam on opposite sides of the beam and wherein the wrist elements for the transverse arms extend in a longitudinal direction toward the center of the beam.

7. The microelectromechanical system of claim 2 wherein the beam is supported at opposed ends by respective pairs of transverse arms extending from the beam on opposite sides of the beam and wherein the wrist elements for the transverse arms extend in a longitudinally direction away the center of the beam.

8. The microelectromechanical system of claim 2 wherein the transverse arms and wrist elements are conductive.

9. The microelectromechanical system of claim 2 wherein including a magnetic field.

10. The microelectromechanical system of claim 2 wherein the transverse arms are of equal length.

11. The microelectromechanical system of claim 2 wherein a point of attachment of the transverse arms at the intermediate point is centered between points of attachment of the transverse arms at the opposed ends of the beam.

12. The microelectromechanical system of claim 2 wherein a first opposing of the beam supports an actuator selected from the group consisting of a Lorentz force motor, an electrostatic motor, a piezoelectric motor, a thermal-expansion motor, and a mechanical-displacement motor.

13. The microelectromechanical system of claim 2 wherein the center arm supports a sensing device selected from the group consisting of: a capacitive sensor, a piezoelectric sensor, a photoelectric sensor, a resistive sensor, an optical switching sensor and an inductive sensor.

14. The microelectromechanical system of claim 2 wherein the ends of the transverse arms removed from the beam are connected to a free end of a transverse expansion element attached to the substrate only at a point proximate to the beam.

15. A microelectromechanical system (MEMS) comprising:
a beam supported on flexible transverse arms to move longitudinally along a substrate, wherein ends of the arms removed from the beam are connected to a free end of a transverse expansion element attached to the substrate only at a point proximate to the beam.

16. A microelectromechanical system (MEMS) comprising:
a beam supported on a first pair of flexible transverse arms that are substantially aligned with one another and extend away from the beam in opposite directions;
a substrate, and
a first pair of pylons supported by the substrate, wherein a respective end of each of the first pair of transverse arms is coupled to a respective one of the first pair of pylons by a respective one of a first pair of wrist components, so that the transverse arms and the beam are supported above the substrate and so that the beam is able to move in relation to the substrate.

17. The microelectromechanical system of claim 16 wherein the wrist components are serpentine.

18. The microelectromechanical system of claim 17 wherein the ends of the arms removed from the beam are serpentine.

19. The microelectromechanical system of claim 16 wherein the ends of the arms removed from the beam are serpentine.

20. The microelectromechanical system of claim 16 wherein the beam is supported at a first end by the first pair of transverse arms and is supported at a second end by a second pair of transverse arms.

21. The microelectromechanical system of claim 16 wherein the transverse arms and wrist components are conductive.

22. The microelectromechanical system of claim 16, further including a magnetic field.

23. The microelectromechanical system of claim 16, wherein the pylons are each positioned adjacent to the beam and wherein each of the pylons is coupled to a respective one of the wrist components by a respective expansion element extending outward away from the beam to the respective wrist component.

24. The microelectromechanical system of claim 23, wherein at least portions of expansion elements have a first width that is greater than a second width of the transverse arms.

25. The microelectromechanical system of claim 16 wherein the transverse arms are of equal length.

26. A microelectromechanical system (MEMS) comprising:
a beam having a longitudinal axis;
first, second and third pairs of flexible transverse arms, wherein the arms of first, second and third pairs extend outward from first, second, and third regions of the beam in substantially opposite directions from the first, second and third regions of the beam, respectively; and
a substrate, wherein the beam is supported above the substrate for movement along its longitudinal axis, and wherein the beam is supported by the first, second and third pairs of flexible transverse arms, which in turn are supported by first, second and third pairs of wrist components that are at least indirectly supported by the substrate.

27. The microelectromechanical system of claim 26 wherein at least some of the ends of the transverse arms are serpentine.

28. The microelectromechanical system of claim 26 wherein at least some of the transverse arms and wrist components are conductive.

29. The microelectromechanical system of claim 26, wherein at least some of the wrist components are coupled by respective intermediate arms to respective pylons, which in turn are supported by the substrate.

30. The microelectromechanical system of claim 29, wherein the pylons are positioned adjacent to the beam.

31. The microelectromechanical system of claim 29, wherein at least portions of the intermediate arms have a first width that is greater than a second width of the transverse arms.

32. A microelectromechanical system (MEMS) comprising:
a beam having a first axis;
a pair of arms coupled to the beam and extending outward from the beam in opposite directions along a second axis that is substantially perpendicular to the first axis;
a pair of flexible end portions coupled respectively to a pair of ends of the respective arms; and
a pair of supports coupled respectively to the pair of flexible end portions, the pair of supports being formed on a substrate,
wherein at least a portion of each of the supports has a first width that is greater than a second width of the respective arms.

33. The microelectromechanical system of claim 32, wherein each of the supports is at least one of a pylon positioned adjacent to the beam and an expansion element.

34. The microelectromechanical system of claim 32, wherein the beam moves longitudinally along the first axis.

* * * * *